United States Patent
Strohmaier et al.

(10) Patent No.: US 11,973,313 B2
(45) Date of Patent: Apr. 30, 2024

(54) DIODE LASER ASSEMBLY AND METHOD FOR PRODUCING A DIODE LASER ASSEMBLY

(71) Applicant: TRUMPF Photonics, Inc., Cranbury, NJ (US)

(72) Inventors: Stephan Strohmaier, Berlin (DE); Arne-Heike Meissner-Schenk, Berlin (DE); Gerald Urban, Neuzelle (DE); Gerd Hansen, Berlin (DE); Christian Carstens, Stahnsdorf (DE)

(73) Assignee: TRUMPF Photonics, Inc., Cranbury, NJ (US)

( * ) Notice: Subject to any disclaimer, the term of this patent is extended or adjusted under 35 U.S.C. 154(b) by 662 days.

(21) Appl. No.: 17/254,625

(22) PCT Filed: Jun. 18, 2019

(86) PCT No.: PCT/EP2019/066008
§ 371 (c)(1),
(2) Date: Dec. 21, 2020

(87) PCT Pub. No.: WO2019/243327
PCT Pub. Date: Dec. 26, 2019

(65) Prior Publication Data
US 2021/0119413 A1    Apr. 22, 2021

(30) Foreign Application Priority Data
Jun. 21, 2018  (DE) .......................... 102018210142.6

(51) Int. Cl.
*H01S 5/024*     (2006.01)
*H01S 5/0237*    (2021.01)

(52) U.S. Cl.
CPC ........ *H01S 5/02423* (2013.01); *H01S 5/0237* (2021.01)

(58) Field of Classification Search
CPC .................................................. H01S 5/02423
(Continued)

(56) References Cited

U.S. PATENT DOCUMENTS 4,393,393 A * 7/1983 Allen, Jr. ............ H01S 5/02423
257/714
7,154,926 B2   12/2006 Kouta et al.
(Continued)

FOREIGN PATENT DOCUMENTS

| CN | 1754903 A | 4/2006 |
| CN | 102067395 A | 5/2011 |

(Continued)

OTHER PUBLICATIONS

Yan Haidong et al, "Effect of as-pinted bondline thickness on assembling high power laser diodes by sintering of nanosilver paste", 2016 17th International Conference on Electronic Packaging Technology (ICEPT), IEEE, Aug. 16, 2016 (Aug. 16, 2016), p. 845-848, XP032974368, DOI: 10.1109 / ICEPT.2016.7583262, p. 845, left col. paragraph 1—p. 846, right column, paragraph 3; Figures 1-5.

*Primary Examiner* — Tuan N Nguyen
(74) *Attorney, Agent, or Firm* — Laurence A. Greenberg; Werner H. Stemer; Ralph E. Locher

(57) ABSTRACT

A diode laser arrangement includes at least one emitter, first and second cooling devices and a first connecting layer. The emitter is configured to emit a laser beam and is disposed between the first and second cooling devices. The first and second cooling devices are each configured for cooling the emitter. The emitter is connected to the first cooling device by the first connecting layer, and the first connecting layer has a connecting material or is composed of a connecting material selected from a group including gold, a gold alloy, silver, a silver alloy, a silver sintered material, copper, a copper alloy, nickel, a nickel alloy, palladium, a palladium
(Continued)

alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead and a lead alloy.

9 Claims, 2 Drawing Sheets

(58) Field of Classification Search
USPC .......................................................... 372/36
See application file for complete search history.

(56) References Cited

U.S. PATENT DOCUMENTS

| | | | |
|---|---|---|---|
| 8,486,766 | B2 | 7/2013 | Schroeder et al. |
| 8,649,405 | B2 | 2/2014 | Schroeder et al. |
| 11,557,881 | B2 * | 1/2023 | Von Freyhold ..... H01S 5/02469 |
| 2006/0029117 | A1 * | 2/2006 | Valiente .............. H01S 5/02365 |
| | | | 372/87 |
| 2006/0081995 | A1 | 4/2006 | Takahashi et al. |
| 2008/0181277 | A1 | 7/2008 | Konig et al. |
| 2009/0185593 | A1 | 7/2009 | Stephens, IV |
| 2010/0270673 | A1 | 10/2010 | Oppermann |
| 2012/0252144 | A1 * | 10/2012 | Schroeder ........... H01S 5/02365 |
| | | | 438/26 |
| 2014/0112363 | A1 | 4/2014 | Feitisch et al. |
| 2018/0062348 | A1 | 3/2018 | Lee et al. |
| 2018/0138664 | A1 * | 5/2018 | Huelsewede ....... H01S 5/02355 |

FOREIGN PATENT DOCUMENTS

| | | |
|---|---|---|
| CN | 102576975 A | 7/2012 |
| CN | 107210581 A | 9/2017 |
| DE | 10226724 A1 | 1/2003 |
| DE | 602004003196 T2 | 9/2007 |
| DE | 102006037198 A1 | 2/2008 |
| DE | 102007001743 A1 | 4/2008 |
| DE | 102009040835 A1 | 3/2011 |
| DE | 102014000510 A1 | 7/2015 |
| DE | 102015002176 A1 | 8/2016 |

* cited by examiner

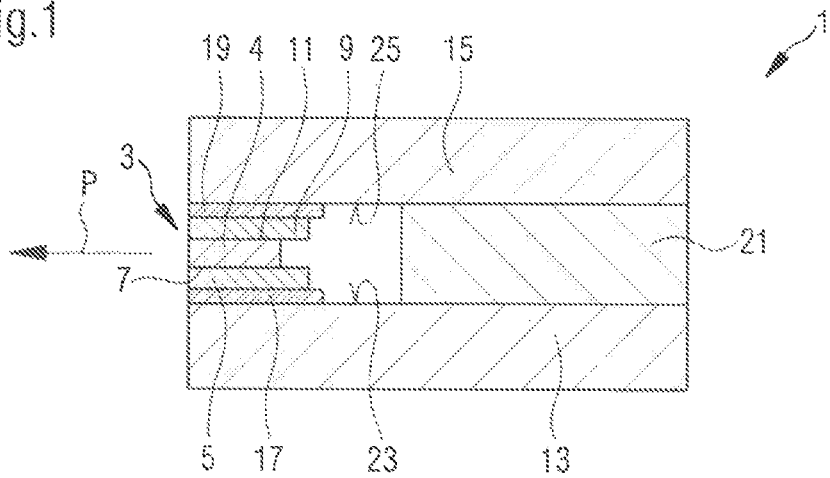
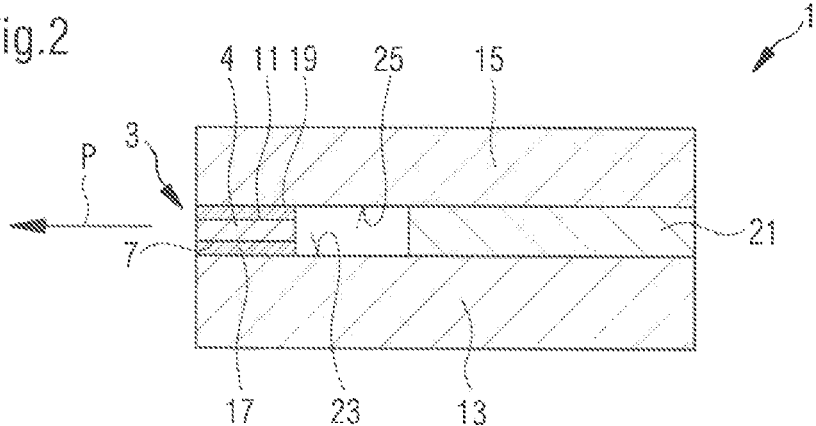
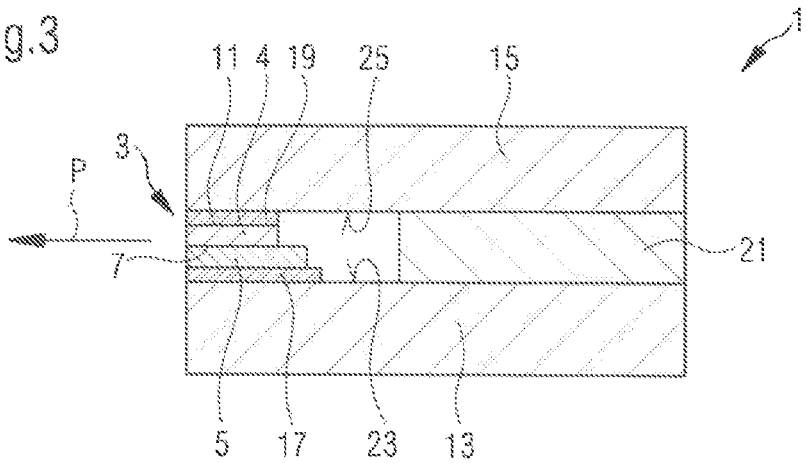

DIODE LASER ASSEMBLY AND METHOD FOR PRODUCING A DIODE LASER ASSEMBLY

BACKGROUND OF THE INVENTION

Field of the Invention

The invention relates to a diode laser arrangement and to a method for producing a diode laser arrangement.

During the operation of emitters, in particular in the high-power range, for example high-power diode laser bars, heat losses are generated which must be dissipated from the emitter or the emitters in order to attain a high output power with simultaneously long service life, high beam quality, and intended and constant beam parameters, for example a high and uniform degree of polarization. Typically, a diode laser arrangement with such emitters has a cooling device which is thermally coupled to the emitter(s) and which is configured for dissipating the heat losses. An arrangement of at least one emitter between two such cooling devices is known in order to increase the cooling power or to realize a thermomechanically symmetrical structure. For the connection of such a cooling device to the at least one emitter, use is typically made of materials, for example hard solders, which, owing to their higher modulus of elasticity in relation to the joining partners, promote or cause mechanical stresses, in particular in a laser-active material of the at least one emitter. Such stresses are dependent in particular on the difference in coefficients of thermal expansion of the joining material, for example of the hard solder, and of the joining partners, as well as on differences in expansion of intermetallic phases in the solder structure. Such stresses have a highly negative effect on the service life, the beam quality and the polarization and severely limit the usability of the diode laser arrangement.

SUMMARY OF THE INVENTION

The invention is based on the object of creating a diode laser arrangement and a method for producing a diode laser arrangement, wherein advantages are realized in relation to known diode laser arrangements in particular with regard to high output power with simultaneously long service life, high beam quality and intended beam parameters.

The object is achieved through the creation of the subjects of the independent claims. Advantageous refinements become apparent from the dependent claims.

The object is achieved in particular through the creation of a diode laser arrangement with at least one emitter, a first cooling device, a second cooling device and a first connecting layer. The at least one emitter is configured to emit a laser beam. Here, the laser beam may also be composed of multiple partial laser beams. This is the case for example if the at least one emitter is formed as a diode laser bar. The at least one emitter is arranged between the first cooling device and the second cooling device. The first cooling device and the second cooling device are in each case configured for cooling the at least one emitter. Here, the at least one emitter is connected to the first cooling device via the first connecting layer. The first connecting layer has a connecting material or is composed of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy. A tin alloy or a lead alloy may for example have lead-tin.

The diode laser arrangement according to the invention has advantages in relation to the prior art. By virtue of the fact that the first connecting layer, by means of which the at least one emitter is connected to the first cooling device, has a connecting material or is composed of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy, it is possible for stresses during the operation of the diode laser arrangement, in particular in the case of high operating temperatures of the at least one emitter, to be significantly reduced or even avoided. For example, a temperature-induced deformation of at least one emitter configured as a diode laser bar can be significantly reduced or even avoided. A service life of the diode laser arrangement, in particular of the at least one emitter, can be significantly increased. Furthermore, a high or higher output power can be achieved, simultaneously with a long service life and high beam quality. Furthermore, spectral properties or geometrical characteristics of the emitted laser beam, for example the degree of polarization, the wavelength or the radiation angle, can be kept constant in narrower ranges. Furthermore, the degree of polarization can be increased. Furthermore, the diode laser arrangement can also be operated as intended at higher temperatures.

The at least one emitter may be formed as a single emitter. Such an emitter is preferably formed as an edge emitter. Such an emitter is preferably formed as a high-power emitter. The at least one emitter is particularly preferably formed as a diode laser bar with multiple emitters, which are preferably arranged in a one-dimensional row (array). Such a diode laser bar is preferably formed as an edge emitter. Such a diode laser bar is preferably formed as a high-power diode laser bar.

In particular, the first cooling device and/or the second cooling device are in each case formed as a heat sink. The first cooling device and/or the second cooling device are preferably in each case configured to be actively coolable. The first cooling device and/or the second cooling device are particularly preferably formed so as to be capable of being flowed through by a cooling fluid, such that heat can be transported away.

A supply and a discharge of the cooling fluid to/from the first cooling device and/or the second cooling device preferably does not take place via a connecting surface of the first cooling device and/or of the second cooling device. A connecting surface of the discussed type in each case denotes in particular a surface of the first cooling device and/or of the second cooling device, on or at which surface the first connecting layer or the second connecting layer respectively is arranged, or a surface facing toward the at least one emitter. A connection in each case for the supply and/or discharge of the cooling fluid is preferably arranged in each case laterally on the first cooling device and/or the second cooling device. In this way, the first cooling device and/or the second cooling device can be flowed through by the cooling fluid independently of one another. In an advantageous manner, temperature differences on an n-side and a p-side of the at least one emitter can thus be reduced or even avoided.

In particular, the first cooling device and the second cooling device are in each case arranged on two mutually oppositely situated sides of the at least one emitter. For example, the first cooling device may be arranged adjacent to a first side of the at least one emitter, and the second cooling device may be arranged adjacent to a second side, situated opposite the first side, of the at least one emitter. For example, a p-side of the at least one emitter may be arranged in the region of the first side and an n-side of the at least one emitter may be arranged in the region of the second side.

In a preferred embodiment of the diode laser arrangement, the first connecting layer is configured to firmly connect the at least one emitter to the first cooling device. It is possible for a submount to be arranged between the at least one emitter and the first cooling device, wherein the at least one emitter is firmly connected via the first connecting layer to the submount or the submount is firmly connected via the first connecting layer to the first cooling device. Such a—first—submount will be described further below as a preferred embodiment of the diode laser arrangement. It is also possible for the first connecting layer to be formed in multiple parts. In particular, it is then possible for the at least one emitter to be firmly connected via the first connecting layer to the submount and for the submount to be firmly connected via a further first connecting layer to the first cooling device. In particular, such a connection is formed as a cohesive and/or positive locking connection which is realized via the first connecting layer. Such a connection is realized in particular by diffusion, adhesion or microserration.

An embodiment of the diode laser arrangement is preferable which is distinguished by the fact that the diode laser arrangement has a second connecting layer. The at least one emitter is preferably connected via the second connecting layer to the second cooling device. Such a connection may also be realized by means of a submount arranged between the at least one emitter and the second cooling device. The second connecting layer has in particular a connecting material or is composed of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy. A tin alloy or a lead alloy may for example have lead-tin. By means of the second connecting layer, a low-stress or even stress-free connection of the at least one emitter to the second cooling device—in particular during the operation of the diode laser arrangement—is possible in an advantageous manner.

In particular, the second connecting layer is configured to firmly connect the at least one emitter to the second cooling device. It is possible for a submount to be arranged between the at least one emitter and the second cooling device, wherein, in particular, wherein the at least one emitter is firmly connected via the second connecting layer to said submount or said submount is firmly connected via the second connecting layer to the second cooling device. Such a—second—submount will be described further below as a preferred embodiment of the diode laser arrangement. It is also possible for the second connecting layer to be formed in multiple parts. In particular, it is then possible for the at least one emitter to be firmly connected via the second connecting layer to said submount and for said submount to be firmly connected via a further second connecting layer to the second cooling device. In particular, such a connection is formed as a cohesive and/or positive locking connection which is realized via the second connecting layer. Such a connection is realized in particular by diffusion, adhesion or microserration.

The diode laser arrangement may have a clamping device which is configured to hold the at least one emitter and the first cooling device, and/or the at least one emitter and the second cooling device, in a predetermined situation relative to one another and/or to connect them to one another, for example by pressing them against one another. In particular, submounts of the discussed type—if provided—and the at least one emitter and/or the cooling devices are held in a predetermined situation relative to one another and/or connected to one another. By means of such a clamping device, it is in particular not necessary for the at least one emitter and the first cooling device to be connected to one another via the first connecting layer, and/or for the at least one emitter and the second cooling device to be connected to one another via the second connecting layer, in such a way that the at least one emitter and the first cooling device or the second cooling device respectively are held together in the intended manner only by means of the first connecting layer or the second connecting layer respectively. In particular, it is possible that the components mentioned then lie loosely against one another, wherein a firm connection is realized by means of the clamping device.

The connecting material gold mentioned in conjunction with the first connecting layer and/or the second connecting layer is in particular soft gold. Soft gold is to be understood in particular to mean pure gold or a gold alloy with soft components. A gold alloy of the discussed type preferably has gold-tin or is composed of gold-tin. A silver sintered material of the discussed type is available as raw material for example as a paste, preform or foil. For example, a paste-like silver sintered material can be applied to the first cooling device and/or to the second cooling device and/or to the at least one emitter by means of a resin dispersion system in order to produce the first and/or second connecting layer respectively. Such an application may also be performed on a first and/or second submount of the type described further above or below.

An embodiment of the diode laser arrangement is preferable which is distinguished by the fact that the diode laser arrangement has a diode laser device which has the at least one emitter, wherein the diode laser device furthermore has a first submount or a second submount, or alternatively a first submount and a second submount. Here, the first connecting layer and/or the second connecting layer may in each case be formed in multiple parts, in particular in two parts. The at least one emitter is preferably connected via the first connecting layer to the first submount and/or via the second connecting layer to the second submount. Alternatively or in addition, the first submount is preferably connected, in particular firmly, via the first connecting layer or via a further first connecting layer to the first cooling device. Such a further first connecting layer is provided in particular if the at least one emitter is connected via a first connecting layer of the discussed type to the first submount. In particular, two first connecting layers of analogous form are then provided. Alternatively or in addition, the second submount is preferably connected, in particular firmly, via the second connecting layer or via a further second connecting layer to the second cooling device. Such a further second connecting layer is provided in particular if the at least one emitter is connected via a second connecting layer of the discussed type to the second submount. In particular, two second connecting layers of analogous form are then provided.

As an alternative to a connection between the at least one emitter and the first or second submount respectively via the first or second connecting layer respectively, a connection may also be realized by means of soldering or by means of a contact foil. Such an alternative type of connection may also be provided between the first or second submount respectively and the first or second cooling device respectively. Alternatively or in addition, the at least one emitter may also be attached to the first submount and/or to the second submount by means of a clamping device of the type already discussed.

A submount of the discussed type is in particular formed as a heat spreader, wherein waste heat from the at least one emitter can be conducted particularly effectively in the direction of the first cooling device or the second cooling device respectively. Furthermore, mechanical stresses owing to different coefficients of thermal expansion of the at least one emitter and of the first and the second cooling device respectively can be compensated for by means of such a submount.

An embodiment of the diode laser arrangement is preferable which is distinguished by the fact that the first connecting layer or the second connecting layer, or alternatively the first connecting layer and the second connecting layer, is/are in each case formed as a coherent layer. A coherent layer is to be understood in particular to mean a layer which is continuous in one or more directions and which is produced by means of the respective connecting material, has the respective connecting material, or is composed thereof.

In particular, the first connecting layer and/or the second connecting layer are/is formed as a thick gold layer, which has a thickness of preferably at least 1 μm and at most 100 μm.

In particular, the first connecting layer and/or the second connecting layer are/is formed as a thick silver layer, which has a thickness of preferably at least 3 μm and at most 100 μm.

In particular, the first connecting layer and/or the second connecting layer are/is formed as a contact foil, in particular as a contact silver foil. Such a contact foil has, in particular, an electrically conductive material, or is configured to be electrically conductive. By means of such a coherent layer, an intended connection and/or a good flow of electrical current between the at least one emitter and the first or the second cooling device respectively can be ensured in an advantageous manner.

An embodiment of the diode laser arrangement is preferable which is distinguished by the fact that the first connecting layer or the second connecting layer, or alternatively the first connecting layer and the second connecting layer, in each case has/have multiple geometrically delimitable subregions. The first and the second connecting layer respectively are therefore in each case not formed as a coherent layer but rather in each case have in particular mutually spaced-apart subregions. It is possible that, prior to assembly of the diode laser arrangement, preferably prior to connection of the at least one emitter to a cooling device or a submount or connection between a submount and a cooling device, the first connecting layer and/or the second connecting layer in each case have multiple geometrically delimitable subregions, wherein, after assembly, the first connecting layer and/or the second connecting layer are/is in each case formed at least in certain regions as a coherent layer.

A connection via the first connecting layer and/or second connecting layer is realized in particular via the respective subregions of the first connecting layer and/or of the second connecting layer respectively.

The subregions of the first connecting layer or of the second connecting layer respectively may in particular be formed in each case substantially in the shape of a stud, droplet or hemisphere. A corresponding connecting material particularly preferably has gold or is composed of gold. Such subregions composed of gold or of a gold alloy are also referred to as gold bumps. The subregions discussed, in particular the subregions formed as gold bumps, preferably have a thickness of at least 5 μm and at most 30 μm. In this way, a mechanically low-stress or even stress-free connection between the associated components during the operation of the diode laser arrangement can be realized.

An embodiment of the diode laser arrangement is preferable which is distinguished by the fact that the connecting material of the first connecting layer or the connecting material of the second connecting layer, or alternatively the connecting material of the first connecting layer and the connecting material of the second connecting layer, are in each case at least regionally of nanoporous form. In particular, here, the respective connecting material has pores whose diameter lies in the range from at least 1 nm to at most 100 nm.

In particular, the connecting material of the first connecting layer and/or of the second connecting layer in each case has nanoporous gold, nanoporous silver or nanoporous platinum or is composed of nanoporous gold, nanoporous silver or nanoporous platinum. Such noble metals are advantageous in particular owing to their resistance to oxidation and ductility. For example, nanoporous gold can be produced from a gold-silver material, wherein a gold sponge, as it were, is created by leaching out the less noble silver, for example by means of acid. Analogously, nanoporous silver can be produced from a silver-copper material. A first or second connecting layer formed in this way has for example a thickness of at least 20 μm and at most 50 μm. Such formation of the first connecting layer or of the second connecting layer respectively ensures a mechanically particularly low-stress or even stress-free connection of the associated components during operation of the diode laser arrangement.

An embodiment of the diode laser arrangement is preferable which is distinguished by the fact that the connecting material of the first connecting layer or the connecting material of the second connecting layer, or alternatively the connecting material of the first connecting layer and the connecting material of the second connecting layer, have/has in each case less than 5% voids. Such a proportion of voids is in particular in relation to a total material volume of the first connecting layer and/or of the second connecting layer. If the first connecting layer and/or the second connecting layer have/has in each case multiple geometrically delimitable subregions, this proportion of voids is in relation to a total material volume of the stated subregions. Such a structure of the first connecting layer or of the second connecting layer respectively allows a mechanically particularly low-stress or even stress-free connection of the associated components during operation of the diode laser arrangement.

An embodiment of the diode laser arrangement is preferable which is distinguished by the fact that the first cooling device or the second cooling device, or alternatively the first cooling device and the second cooling device, are in each case configured to make electrical contact with the at least one emitter. Preferably, the first connecting layer and/or the second connecting layer, or the respective connecting material, are/is preferably of electrically conductive form such that, in particular, electrical contacting of the at least one emitter via the first cooling device and the first connecting layer and/or via the second cooling device and the second connecting layer is possible. In particular, a first submount and/or a second submount of the discussed type are/is also of electrically conductive form such that, preferably, a current flow between a cooling device and the at least one emitter is possible. Particularly reliable electrical contacting of the at least one emitter can be realized by means of the diode laser arrangement according to the invention.

The object is in particular also achieved through the creation of a method for producing a diode laser arrangement. It is particularly preferable that, in the course of the method, a diode laser arrangement according to one of the embodiments described above is produced. In the context of the method, at least one emitter is arranged between a first cooling device and a second cooling device. Here, the at least one emitter is connected to the first cooling device via a first connecting layer. Here, the first connecting layer is produced by means of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy. In particular, the advantages that have already been discussed in conjunction with the diode laser arrangement are obtained in the context of the method.

An embodiment of the method is preferable which is distinguished by the fact that the at least one emitter is connected via a second connecting layer to the second cooling device. Preferably, here, the second connecting layer is produced by means of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy. Preferably, the first connecting layer and the second connecting layer in each case have the same connecting material. In this way, the diode laser arrangement can be produced particularly economically. Alternatively, the first connecting layer and the second connecting layer may in each case also have connecting materials of different form. In this way, it is possible to realize an adaptation of properties of the connecting layers, for example of a coefficient of thermal expansion, to respectively different requirements. In particular, the differences in expansion of the joining partners or the differences in the various coefficients of thermal expansion can be better compensated for. Furthermore, it is for example possible for the diode laser arrangement to be assembled in stages by creating connecting layers with different melting points. In this way, it can be avoided that an existing connection is not damaged by introduction of heat during a subsequent connection process. The advantageous result is greater freedom in the selection of method steps and materials.

An embodiment of the method is preferable which is distinguished by the fact that the first connecting layer or the second connecting layer, or alternatively the first connecting layer and the second connecting layer, are produced by means of a bonding process (bonding). Temperatures and pressures during the execution of the bonding process are selected in particular in a manner dependent on the connecting materials used and a configuration of the bonding process.

An embodiment of the method is preferable which is distinguished by the fact that the bonding process is a process selected from a group comprising a thermocompression process, in particular thermocompression welding, sintering and vacuum soldering. Particularly preferably, the first connecting layer is realized analogously to the second connecting layer with regard to the process used for production. In this way, the diode laser arrangement can be produced particularly economically.

The description of the diode laser arrangement, on the one hand, and of the method for producing a diode laser arrangement, on the other hand, are to be understood as complementary to one another. Features of the diode laser arrangement that have been discussed explicitly or implicitly in conjunction with the method are preferably, individually or in combination with one another, features of a preferred embodiment of the diode laser arrangement. Method steps that have been discussed explicitly or implicitly in conjunction with the diode laser arrangement are preferably, individually or in combination with one another, steps of a preferred embodiment of the method. Said method is preferably distinguished by at least one method step which is necessitated by at least one feature of an embodiment according to the invention, or preferred embodiment, of the diode laser arrangement. The diode laser arrangement is preferably distinguished by at least one feature which is necessitated by at least one step of an embodiment according to the invention, or preferred embodiment, of the method.

The invention will be discussed in more detail below on the basis of the drawing.

BRIEF DESCRIPTION OF THE SEVERAL VIEWS OF THE DRAWING

FIG. 1 is a schematic illustration of a first exemplary embodiment of a diode laser arrangement in longitudinal section, FIG. 2 is a schematic illustration of a second exemplary embodiment of the diode laser arrangement in longitudinal section, FIG. 3 is a schematic illustration of a third exemplary embodiment of the diode laser arrangement in longitudinal section.

DETAILED DESCRIPTION OF THE INVENTION

Figure 4:
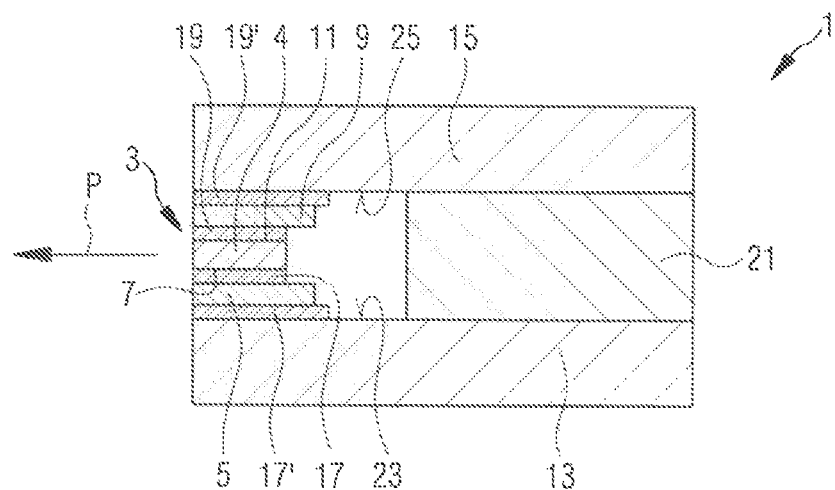
FIG. 4 is a schematic illustration of a fourth exemplary embodiment of the diode laser arrangement in longitudinal section.

FIG. 1 schematically illustrates a first exemplary embodiment of a diode laser arrangement 1 in longitudinal section. The diode laser arrangement 1 has a diode laser device 3. The diode laser device 3 has at least one emitter 4, for example a high-power diode laser bar, which is formed as an edge emitter. The at least one emitter 4 is configured to emit a laser beam. A laser beam axis of the laser beam is denoted schematically by an arrow P. The longitudinal section as per FIG. 1 and FIGS. 2 to 5 extends along this laser beam axis P.

The diode laser device 3 furthermore has a first submount 5. The first submount 5 is arranged on a first side 7 of the at least one emitter 4. In particular, the first submount 5 is firmly connected to the at least one emitter 4, for example by soldering. For example, a p-side of the at least one emitter 4 may be arranged in the region of the first side 7. The diode laser device 3 furthermore has a second submount 9. The second submount 9 is arranged on a second side 11 of the at least one emitter 4. In particular, the second submount 9 is firmly connected to the at least one emitter 4, for example by soldering. For example, an n-side of the at least one emitter 4 may be arranged in the region of the second side 11. Here, the at least one emitter 4 is thus arranged between the first submount 5 and the second submount 9 in, as it were, a sandwich-like manner. Here, the first submount 5 and the second submount 9 are in each case of plate-like form.

The diode laser arrangement 1 furthermore has a first cooling device 13 and a second cooling device 15. The at least one emitter 4 and the diode laser device 3 respectively are arranged between the first cooling device 13 and the second cooling device 15. The first cooling device 13 and the second cooling device 15 are in each case configured for cooling the at least one emitter 4.

By means of the first submount 5 and the second submount 9, waste heat from the at least one emitter 4 can be conducted particularly effectively to the first cooling device 13 and to the second cooling device 15, in particular through heat spreading. Furthermore, it is possible in particular for mechanical stresses owing to different coefficients of thermal expansion of the at least one emitter 4 and of the first cooling device 13 and of the second cooling device 15 respectively to be compensated for by means of the first submount 5 and the second submount 9. Such an embodiment is suitable in particular if the at least one emitter 4 is formed as a high-power emitter.

The diode laser arrangement 1 furthermore has a first connecting layer 17. The at least one emitter 4 is connected via the first connecting layer 17 to the first cooling device 13. In this exemplary embodiment, the at least one emitter 4 is connected via the first submount 5 and via the first connecting layer 17 to the first cooling device 13. Here, the first submount 5 is connected via the first connecting layer 17 to the first cooling device 13.

The first connecting layer 17 has a connecting material or is composed of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy.

Furthermore, the diode laser arrangement 1 has a second connecting layer 19, wherein the at least one emitter 4 is connected via the second connecting layer 19, in this case via the second submount 9 and the second connecting layer 19, to the second cooling device 15. Here, the second submount 9 is thus connected via the second connecting layer 19 to the second cooling device 15.

The second connecting layer 19 has in particular a connecting material or is composed of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy.

For the sake of clarity, the first connecting layer 17 and the second connecting layer 19 are illustrated schematically in FIG. 1 in particular with regard to their thickness, wherein, in a real embodiment, the respective thickness of the diode laser arrangement 1 in relation to the diode laser device 3 may be significantly smaller.

The diode laser arrangement 1 has a spacer element 21 which is arranged so as to be situated opposite the diode laser device 3. The spacer element 21 is configured in particular to set a defined spacing of the first cooling device 13 and of the second cooling device 15 to one another.

Optionally, the first cooling device 13 and/or the second cooling device 15 are/is in each case formed so as to be capable of being flowed through by a cooling fluid, such that waste heat of the at least one emitter 4 can be transported away. A supply and/or a discharge of the cooling fluid to/from the first cooling device 13 preferably do/does not take place via a first connecting surface 23 of the first cooling device 13, on or at which surface the first connecting layer 17 is arranged or which surface faces toward the at least one emitter 4. Analogously, a supply and/or a discharge of the cooling fluid to/from the second cooling device 15 preferably do/does not take place via a second connecting surface 25 of the second cooling device 15, on or at which surface the second connecting layer 19 is arranged or which surface faces toward the at least one emitter 4. A connection or connections in each case for the supply and/or discharge of the cooling fluid is/are preferably arranged laterally on the first cooling device 13 and/or on the second cooling device 15. Such a lateral arrangement specifies in particular an arrangement on a surface or side of the first cooling device 13 which adjoins the first connecting layer 23, or an arrangement on a surface or side of the second cooling device 15 which adjoins the second connecting surface 25, respectively. It is likewise possible for such a connection to be arranged in each case on a surface of the first cooling device 13 which is situated opposite the first connecting surface 23 and/or on a side of the second cooling device 15 which is situated opposite the second connecting surface 25. In this way, the first cooling device 13 and/or the second cooling device 15 can be flowed through by the cooling fluid independently of one another.

Optionally, the first connecting layer 17 and/or the second connecting layer 19 are—as illustrated in FIG. 1—in each case formed as a coherent layer. In particular, the first connecting layer 17 and/or the second connecting layer 19 may be formed as a thick gold layer, thick silver layer or contact foil.

Alternatively—in a manner not shown in FIG. 1—the first connecting layer 17 and/or the second connecting layer 19 may in each case have multiple geometrically delimitable, in particular mutually spaced-apart, subregions. Said subregions may for example be formed as gold bumps.

Optionally, the connecting material of the first connecting layer 17 and/or of the second connecting layer 19 is in each case at least regionally of nanoporous form. For example, the connecting material has nanoporous gold, silver or platinum or is composed of nanoporous gold, silver or platinum.

Optionally, the connecting material of the first connecting layer 17 and/or of the second connecting layer 19 has in each case less than 5% voids.

Optionally, the first cooling device 13 and/or the second cooling device 15 are/is in each case configured to make electrical contact with the at least one emitter 4. In particular, the first connecting layer 17 and/or the second connecting layer 19 are/is of electrically conductive form, such that electrical contacting of the at least one emitter 4 can be realized in this way.

FIG. 2 illustrates a second exemplary embodiment of the diode laser arrangement 1 schematically in longitudinal section. Identical and functionally identical elements are denoted by the same reference designations, such that, in this regard, reference is made to the description above. By contrast to FIG. 1, the diode laser device 3 according to this exemplary embodiment has no first submount 5 and no second submount 9. Rather, the at least one emitter 4 on the first side 7 is arranged directly via the first connecting layer 17 on the first cooling device 13. Analogously, the at least one emitter 4 on the second side 11 is arranged directly via the second connecting layer 19 on the second cooling device 15. Such an embodiment can be implemented particularly economically.

FIG. 3 illustrates a third exemplary embodiment of the diode laser arrangement 1 schematically in longitudinal section. Identical and functionally identical elements are denoted by the same reference designations, such that, in this regard, reference is made to the description above. Here, the diode laser device 3 has a first submount 5 of the discussed type, whereas no second submount 9 of the type already discussed is provided. Such an embodiment is particularly suitable if the laser beam is emitted close to the first side 7, which lies for example in the region of a p-side of the at least one emitter 4. In this case, more waste heat accumulates in the region of the first side 7 than in the region of the second side 11, wherein said waste heat can be dissipated via the first submount 5, in particular in a spread manner.

FIG. 4 illustrates a fourth exemplary embodiment of the diode laser arrangement 1 schematically in longitudinal section. Identical and functionally identical elements are denoted by the same reference designations, such that, in this regard, reference is made to the description above. The diode laser arrangement 1 is basically configured analogously to FIG. 1, but has two first connecting layers 17, 17' and two second connecting layers 19, 19'. Here, the at least one emitter 4 is connected via the first connecting layer 17 to the first submount 5 and via the second connecting layer 19 to the second submount 9. Furthermore, the first submount 5 is connected via a further first connecting layer 17' to the first cooling device 13. The second submount 9 is connected via a further second connecting layer 19' to the second cooling device 15.

In a further exemplary embodiment which is not illustrated in the drawing, the diode laser arrangement 1 is formed as a combination of the exemplary embodiments as per FIGS. 1 and 4. Here, the diode laser arrangement 1 has a first connecting layer 17 between the at least one emitter 4 and the first submount 5 and a further first connecting layer 17' between the first submount 5 and the first cooling device 13. Furthermore, the diode laser arrangement 1 has exactly one second connecting layer 19 between the second submount 9 and the second cooling device 15. A connection between the at least one emitter 4 and the second submount 9 is realized in some other way, for example by means of soldering or a contact foil. Alternatively, it is also possible for exactly one first connecting layer 17 as per FIG. 1 and two second connecting layers 19, 19' as per FIG. 4 to be provided.

Figure 5:
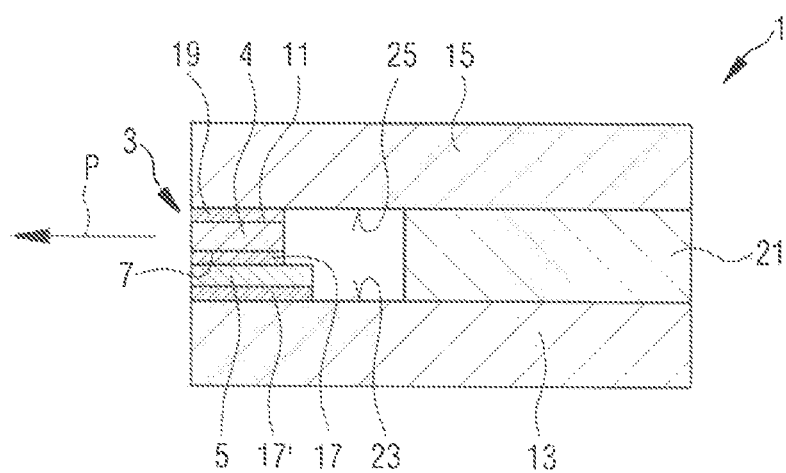
FIG. 5 is a schematic illustration of a fifth exemplary embodiment of the diode laser arrangement in longitudinal section.

FIG. 5 illustrates a fifth exemplary embodiment of the diode laser arrangement 1 schematically in longitudinal section. Identical and functionally identical elements are denoted by the same reference designations, such that, in this regard, reference is made to the description above. Here, the diode laser arrangement 1 is configured analogously to FIG. 3, wherein, however, a first connecting layer 17 is provided between the at least one emitter 4 and the first submount 5 and a further first connecting layer 17' is provided between the first submount 5 and the first cooling device 13.

It is self-evidently possible for further exemplary embodiments to be formed by combining the features described, which further exemplary embodiments are however not illustrated in the drawing for the sake of clarity.

A method for producing a diode laser arrangement 1, in particular a diode laser arrangement 1 according to any of the exemplary embodiments described above, will be described below. In the context of the method, at least one emitter 4 is arranged between a first cooling device 13 and a second cooling device 15. Here, the at least one emitter 4 is connected via a first connecting layer 17, 17' to the first cooling device 13. Here, the first connecting layer 17, 17' is produced by means of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy.

Optionally, the at least one emitter 4 is connected via a second connecting layer 19, 19' to the second cooling device 15. The second connecting layer 19, 19' is in particular produced by means of a connecting material which is selected from a group comprising gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead, and a lead alloy.

Optionally, the first connecting layer 17, 17' and/or the second connecting layer 19, 19' are/is produced by means of a bonding process. Optionally, the bonding process is a process selected from a group comprising a thermocompression process, in particular thermocompression welding, sintering and vacuum soldering.

Overall, it can be seen that, by means of the diode laser arrangement 1 according to the invention and the method for producing the diode laser arrangement 1, a mechanically low-stress or even stress-free connection of the at least one emitter 4 to the first cooling device 13 and to the second cooling device 15 can be realized in an economical manner.

The invention claimed is:

1. A diode laser arrangement, comprising:
   a first cooling device;
   a second cooling device;
   at least one emitter configured to emit a laser beam, said at least one emitter disposed between said first cooling device and said second cooling device;
   said first cooling device and said second cooling device configured for cooling said at least one emitter;
   a first connecting layer connecting said at least one emitter to said first cooling device, said first connecting layer having a connecting material or being composed of a connecting material selected from a group consisting of gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead and a lead alloy;

a second connecting layer connecting said at least one emitter to said second cooling device, said second connecting layer having a connecting material or being composed of a connecting material selected from a group consisting of gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead and a lead alloy; and at least one of said first connecting layer or said second connecting layer being formed of at least regionally nanoporous connecting material.

2. The diode laser arrangement according to claim 1, which further comprises:

a diode laser device having said at least one emitter, said diode laser device having at least one of a first submount or a second submount;

said at least one emitter being at least one of connected by said first connecting layer to said first submount or connected by said second connecting layer to said second submount; and at least one of said first submount being connected by said first connecting layer or a further first connecting layer to said first cooling device or said second submount being connected by second connecting layer or a further second connecting layer to said second cooling device.

3. The diode laser arrangement according to claim 1, wherein at least one of said first connecting layer or said second connecting layer being formed as a coherent layer.

4. The diode laser arrangement according to claim 1, wherein at least one of said first connecting layer or said second connecting layer having multiple geometrically delimitable subregions.

5. The diode laser arrangement according to claim 1, wherein said connecting material of at least one of said first connecting layer or said second connecting layer having less than 5% voids.

6. The diode laser arrangement according to claim 1, wherein at least one of said first cooling device or said second cooling device being configured to make electrical contact with said at least one emitter.

7. A method for producing a diode laser arrangement, the method comprising:

placing at least one emitter, configured to emit a laser beam, between a first cooling device and a second cooling device configured for cooling the at least one emitter;

using a first connecting layer to connect the at least one emitter to the first cooling device; and producing the first connecting layer from a connecting material selected from a group consisting of gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead and a lead alloy;

using a second connecting layer to connect the at least one emitter to the second cooling device, and producing the second connecting layer from a connecting material selected from a group consisting of gold, a gold alloy, silver, a silver alloy, a silver sintered material, copper, a copper alloy, nickel, a nickel alloy, palladium, a palladium alloy, platinum, a platinum alloy, rhodium, a rhodium alloy, iridium, an iridium alloy, germanium, a germanium alloy, tin, a tin alloy, aluminum, an aluminum alloy, indium, an indium alloy, lead and a lead alloy; and forming at least one of the first connecting layer or the second connecting layer of at least regionally nanoporous connecting material.

8. The method according to claim 7, which further comprises producing at least one of the first connecting layer or the second connecting layer by a bonding process.

9. The method according to claim 8, which further comprises selecting the bonding process from a group consisting of a thermocompression process, sintering and vacuum soldering.

* * * * *